(12) United States Patent
Shiokawa

(10) Patent No.: US 11,171,622 B2
(45) Date of Patent: Nov. 9, 2021

(54) BALANCED FILTER

(71) Applicant: Murata Manufacturing Co., Ltd., Nagaokakyo (JP)

(72) Inventor: Noboru Shiokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/931,488

(22) Filed: Jul. 17, 2020

(65) Prior Publication Data

US 2020/0350885 A1 Nov. 5, 2020

Related U.S. Application Data

(63) Continuation of application No. PCT/JP2019/004169, filed on Feb. 6, 2019.

(30) Foreign Application Priority Data

Feb. 13, 2018 (JP) .............................. JP2018-023546

(51) Int. Cl.
*H03H 7/01* (2006.01)
*H03H 7/38* (2006.01)
(Continued)

(52) U.S. Cl.
CPC ....... *H03H 7/0115* (2013.01); *H01F 27/2804* (2013.01); *H03H 7/09* (2013.01);
(Continued)

(58) Field of Classification Search
CPC .. H03H 7/38; H03H 7/42; H03H 7/09; H03H 2001/0085
(Continued)

(56) References Cited

U.S. PATENT DOCUMENTS 6,768,410 B1 7/2004 Yazaki et al.
2003/0114129 A1* 6/2003 Jerng ....................... H04B 1/18
455/323

(Continued)

FOREIGN PATENT DOCUMENTS

JP 2003-007537 A 1/2003
JP 2003-018039 A 1/2003
(Continued)

OTHER PUBLICATIONS

Official Communication issued in International Patent Application No. PCT/JP2019/004169, dated Apr. 9, 2019.

*Primary Examiner* — Rakesh B Patel
(74) *Attorney, Agent, or Firm* — Keating & Bennett, LLP

(57) ABSTRACT

A balanced filter includes an unbalanced terminal, an unbalanced-side inductor, a first balanced terminal, a second balanced terminal, a balanced-side inductor, a power supply line, and a matching network. The unbalanced-side inductor is provided between the unbalanced terminal and a ground. The balanced-side inductor is provided between the first balanced terminal and the second balanced terminal and couples to the unbalanced-side inductor via an electromagnetic field. The power supply line includes a first end connected to a middle portion of the balanced-side inductor and a second end connected to a direct-current power supply. The matching network matches a first impedance between the first balanced terminal and the second end of the power supply line to a second impedance between the second balanced terminal and the second end of the power supply line.

19 Claims, 7 Drawing Sheets

(51) Int. Cl.
*H03H 7/42* (2006.01)
*H03H 7/09* (2006.01)
*H01F 27/28* (2006.01)
*H03H 1/00* (2006.01)

(52) U.S. Cl.
CPC ............... *H03H 7/38* (2013.01); *H03H 7/42* (2013.01); *H03H 2001/0085* (2013.01)

(58) Field of Classification Search
USPC ........................................ 333/32, 175, 185
See application file for complete search history.

(56) References Cited

U.S. PATENT DOCUMENTS

| | | |
|---|---|---|
| 2009/0039977 A1 | 2/2009 | Lee et al. |
| 2012/0098623 A1* | 4/2012 | Taniguchi ................ H03H 7/42 333/185 |
| 2012/0139658 A1 | 6/2012 | Mu |
| 2018/0234073 A1 | 8/2018 | Taniguchi |

FOREIGN PATENT DOCUMENTS

| | | |
|---|---|---|
| JP | 2005-005881 A | 1/2005 |
| WO | 2017/068898 A1 | 4/2017 |

\* cited by examiner

FREQUENCY [0.5 GHz to 12.0 GHz]

BALANCED FILTER

CROSS REFERENCE TO RELATED APPLICATIONS

This application claims the benefit of priority to Japanese Patent Application No. 2018-023546 filed on Feb. 13, 2018 and is a Continuation Application of PCT Application No. PCT/JP2019/004169 filed on Feb. 6, 2019. The entire contents of each application are hereby incorporated herein by reference.

BACKGROUND OF THE INVENTION

1. Field of the Invention

The present invention relates, in general, to a balanced filter, and, more specifically, to a balanced filter including one unbalanced terminal and two balanced terminals.

2. Description of the Related Art

In the related art, a balanced filter includes one unbalanced terminal, a balanced terminal including a first terminal and a second terminal, an unbalanced-side inductor, and a balanced-side inductor (for example, see International Publication No. 2017/068898).

The unbalanced-side inductor is electrically connected to the unbalanced terminal. The balanced-side inductor is connected between the first terminal and the second terminal of the balanced terminal. A DC feed terminal is connected to a middle portion of the balanced-side inductor.

In the balanced filter disclosed in International Publication No. 2017/068898, when the DC feed terminal is provided, inductance values between the respective first terminal and second terminal and a connection point of the DC feed terminal in the balanced-side inductor differ from each other in some cases, and the impedance between the first terminal of the balanced terminal and a ground does not match the impedance between the second terminal of the balanced terminal and the ground in some cases. As a result, a common mode signal that becomes noise in a pass band is not able to be sufficiently attenuated, and desired input/output characteristics are not obtained in some cases.

SUMMARY OF THE INVENTION

Preferred embodiments of the present invention provide balanced filters that each enable attenuation of a common mode signal in a pass band.

A balanced filter according to a preferred embodiment of the present invention includes an unbalanced terminal, an unbalanced-side inductor, a first balanced terminal, a second balanced terminal, a balanced-side inductor, a power supply line, and a matching network. The unbalanced-side inductor is provided between the unbalanced terminal and a ground. The balanced-side inductor is provided between the first balanced terminal and the second balanced terminal and couples to the unbalanced-side inductor via an electromagnetic field. The power supply line includes a first end connected to a middle portion of the balanced-side inductor and a second end connected to a direct-current power supply. The matching network matches a first impedance between the first balanced terminal and the second end of the power supply line to a second impedance between the second balanced terminal and the second end of the power supply line.

Preferred embodiments of the present invention enable attenuation of a common mode signal that becomes noise in a pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Balanced filters according to preferred embodiments of the present invention will be described below with reference to the drawings.

All of FIGS. 2, 3, 6A to 6D, and 7A to 7D that are referred to in the following preferred embodiments are schematic diagrams, and a size ratio or thickness ratio between components in the figures does not necessarily reflect an actual dimensional ratio.

(1) Entire Configuration of Balanced Filter

Figure 1:
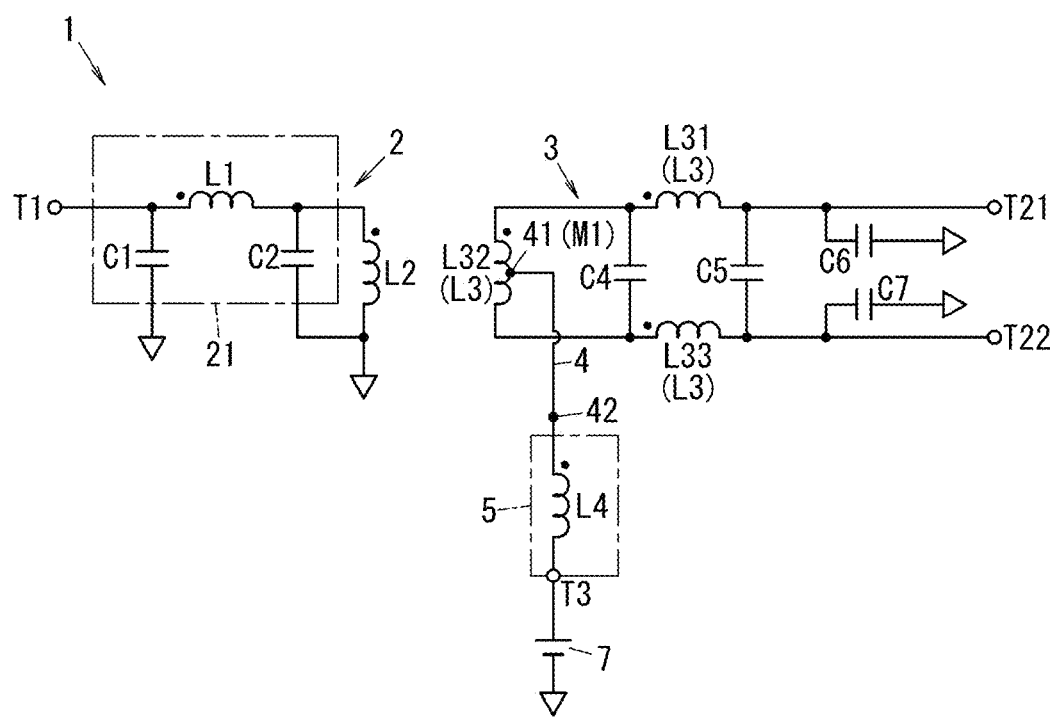
FIG. 1 is a circuit diagram of a balanced filter according to a preferred embodiment of the present invention.

First, an entire configuration of a balanced filter 1 according to a preferred embodiment of the present invention will be described with reference to FIG. 1. FIG. 1 is a circuit diagram of the balanced filter 1 according to the present preferred embodiment.

The balanced filter 1 according to the present preferred embodiment is, for example, a balanced-unbalanced conversion circuit provided between a divider (unbalanced circuit) to which an antenna is connected and an RF (Radio Frequency) circuit (balanced circuit) in a communication device, such as a smartphone. The balanced filter 1 performs signal conversion between an unbalanced signal from the divider and a balanced signal from the RF circuit. The balanced filter 1 described herein converts a balanced signal from the RF circuit to an unbalanced signal and outputs the unbalanced signal to the divider.

The balanced filter 1 according to the present preferred embodiment includes, as illustrated in FIG. 1, an unbalanced terminal T1, an unbalanced-side inductor L2, a first balanced terminal T21, a second balanced terminal T22, a balanced-side inductor L3, a power supply line 4, and a matching network 5.

The unbalanced-side inductor L2 is provided between the unbalanced terminal T1 and a ground. The balanced-side inductor L3 is provided between the first balanced terminal T21 and the second balanced terminal T22 and couples to the unbalanced-side inductor L2 via an electromagnetic field. The balanced-side inductor L3 described herein preferably includes three inductors: a first inductor L31, a second inductor L32, and a third inductor L33. The unbalanced-side inductor L2 couples mainly to the second inductor L32 via an electromagnetic field.

With respect to the power supply line 4, a first end 41 is electrically connected to a middle portion M1 of the balanced-side inductor L3, and a second end 42 is electrically connected to a direct-current power supply 7. In the present description, "a middle portion of a balanced-side inductor" refers to, of the balanced-side inductor, an inductor coupled to an unbalanced-side inductor via an electromagnetic field. For example, in the present preferred embodiment, of the balanced-side inductor L3 including the first inductor L31, the second inductor L32, and the third inductor L33, the second inductor L32 is coupled to the unbalanced-side inductor L2 via an electromagnetic field, and the second inductor L32 is the middle portion of the balanced-side inductor L3. In this case, when the power supply line 4 is electrically connected to the second inductor L32, it can be said that the power supply line 4 is electrically connected to the middle portion of the balanced-side inductor L3. The power supply line 4 supplies direct-current power from the direct-current power supply 7 to the balanced-side inductor L3.

The matching network 5 matches a first impedance between the first balanced terminal T21 and the second end 42 of the power supply line 4 to a second impedance between the second balanced terminal T22 and the second end 42 of the power supply line 4. The first impedance described herein is an impedance of an electrical path extending from the first balanced terminal T21 to the second end 42 of the power supply line 4 through the first inductor L31 and a portion of the second inductor L32 of the balanced-side inductor L3 and the power supply line 4. The second impedance described herein is an impedance of an electrical path extending from the second balanced terminal T22 to the second end 42 of the power supply line 4 through the third inductor L33 and a portion of the second inductor L32 of the balanced-side inductor L3 and the power supply line 4. In the present description, "impedance matching is achieved" refers to a situation in which, in the case where an imaginary part of the first impedance is larger than an imaginary part of the second impedance, a ratio of the imaginary part of the second impedance to the imaginary part of the first impedance is, for example, not less than about 0.5 and not more than about 1, or refers to a situation in which, in the case where the imaginary part of the second impedance is larger than the imaginary part of the first impedance, a ratio of the imaginary part of the first impedance to the imaginary part of the second impedance is, for example, not less than about 0.5 and not more than about 1. Details will be described below.

(2) Details of Balanced Filter

Next, details of the balanced filter 1 according to the present preferred embodiment will be described with reference to FIG. 1. The balanced filter 1 according to the present preferred embodiment includes an unbalanced-side circuit 2 and a balanced-side circuit 3.

(2.1) Unbalanced-Side Circuit

The unbalanced-side circuit 2 includes, as illustrated in FIG. 1, the unbalanced terminal T1, the unbalanced-side inductor L2, and a low pass filter 21.

The low pass filter 21 is preferably, for example, a π-type low pass filter. The low pass filter 21 includes an inductor L1, and two capacitors C1 and C2. One end of the inductor L1 is electrically connected to the unbalanced terminal T1, and the other end of the inductor L1 is electrically connected to one end of the unbalanced-side inductor L2. The other end of the unbalanced-side inductor L2 is electrically connected to the ground. In other words, the unbalanced-side inductor L2 is provided (connected) between the unbalanced terminal T1 and the ground.

The capacitor C1 is provided (connected) between the unbalanced terminal T1 and the ground. The capacitor C2 is provided (connected) between a connection point of the inductor L1 and the unbalanced-side inductor L2 and the ground. In other words, the capacitor C2 is electrically connected in parallel with the unbalanced-side inductor L2. The unbalanced-side inductor L2 and the capacitor C2 define a first LC parallel resonant circuit.

In the balanced filter 1 according to the present preferred embodiment, the low pass filter 21 allows only a signal having any selected frequency (in any selected pass band) to pass therethrough.

(2.2) Balanced-Side Circuit

The balanced-side circuit 3 includes, as illustrated in FIG. 1, the first balanced terminal T21, the second balanced terminal T22, the balanced-side inductor L3, and four capacitors C4 to C7.

The balanced-side inductor L3 is provided (connected) between the first balanced terminal T21 and the second balanced terminal T22. The balanced-side inductor L3 described herein is defined by three inductors: the first inductor L31, the second inductor L32, and the third inductor L33. One end of the first inductor L31 is electrically connected to the first balanced terminal T21, and the other end of the first inductor L31 is electrically connected to one end of the second inductor L32. The other end of the second inductor L32 is electrically connected to one end of the third inductor L33, and the other end of the third inductor L33 is electrically connected to the second balanced terminal T22. In other words, the first inductor L31, the second inductor L32, and the third inductor L33 are electrically connected in series between the first balanced terminal T21 and the second balanced terminal T22.

In the present description, "electromagnetic field coupling" is a concept including both of electrostatic coupling and magnetic field coupling. The words "an electromagnetic field coupling is provided" between the unbalanced-side inductor L2 and the balanced-side inductor L3 refer to a situation in which the unbalanced-side inductor L2 and the balanced-side inductor L3 are disposed so that the electromagnetic field coupling is possible during operation of the balanced filter 1. In the present preferred embodiment, the unbalanced-side inductor L2 is configured to couple mainly to the second inductor L32 of the balanced-side inductor L3 via an electromagnetic field. Here, if capacitance generated between the unbalanced-side inductor L2 and the balanced-side inductor L3 is not less than about 0.536 [μC/m$^2$], it can be said that the electromagnetic field coupling between the unbalanced-side inductor L2 and the balanced-side inductor L3 is achieved. The same holds true for an electromagnetic field coupling between the balanced-side inductor L3 and a matching inductor L4 (to be described) and an electromagnetic field coupling between the unbalanced-side inductor L2 and the matching inductor L4.

The capacitor C4 is provided (connected) between a connection point of the first inductor L31 and the second inductor L32 and a connection point of the second inductor L32 and the third inductor L33. The capacitor C5 is provided (connected) between the first balanced terminal T21 and the second balanced terminal T22. The balanced-side inductor L3 (the first inductor L31, the second inductor L32, and the third inductor L33) and the capacitors C4 and C5 define and function as a second LC parallel resonant circuit. Then, the second LC parallel resonant circuit defines and functions a band pass filter in conjunction with the above-described first LC parallel resonant circuit. This band pass filter allows only a signal having any selected frequency (in any selected pass band) to pass between the unbalanced terminal T1 and the first balanced terminal T21 and second balanced terminal T22.

The capacitor C6 is provided (connected) between the first balanced terminal T21 and the ground. The capacitor C7 is provided (connected) between the second balanced terminal T22 and the ground. These capacitors C6 and C7 define and function as a noise filter and remove noise included in balanced signals input from the first balanced terminal T21 and the second balanced terminal T22. In the present preferred embodiment, an impedance from the first balanced terminal T21 to the ground through the capacitor C6 and an impedance from the second balanced terminal T22 to the ground through the capacitor C7 are preferably the same or substantially the same value, for example.

The balanced-side circuit 3 further includes the power supply line 4 and the matching network 5.

The first end 41 of the power supply line 4 is electrically connected to the middle portion M1 of the balanced-side inductor L3 (strictly speaking, the second inductor L32), and the second end 42 of the power supply line 4 is electrically connected to the matching network 5.

The matching network 5 includes, as illustrated in FIG. 1, the matching inductor L4 and a power supply terminal T3. One end of the matching inductor L4 is electrically connected to the power supply line 4, and the other end of the matching inductor L4 is electrically connected to the power supply terminal T3. The direct-current power supply 7 is electrically connected to the power supply terminal T3. In other words, the matching inductor L4 of the matching network 5 is provided (connected) between the power supply line 4 electrically connected to the middle portion M1 of the balanced-side inductor L3 and the direct-current power supply 7.

The matching inductor L4 is configured to couple to the balanced-side inductor L3 via an electromagnetic field during signal conversion. Furthermore, the matching inductor L4 is configured to couple to the unbalanced-side inductor L2 as well via an electromagnetic field during signal conversion. That is, the matching inductor L4 is configured to couple to both of the unbalanced-side inductor L2 and the balanced-side inductor L3 via an electromagnetic field during signal conversion.

In the balanced filter 1, direct-current power supplied from the direct-current power supply 7 via the power supply line 4 can increase the strength of an unbalanced signal output from the unbalanced terminal T1.

(3) Structure of Balanced Filter (3.1) First Example

Figure 2:
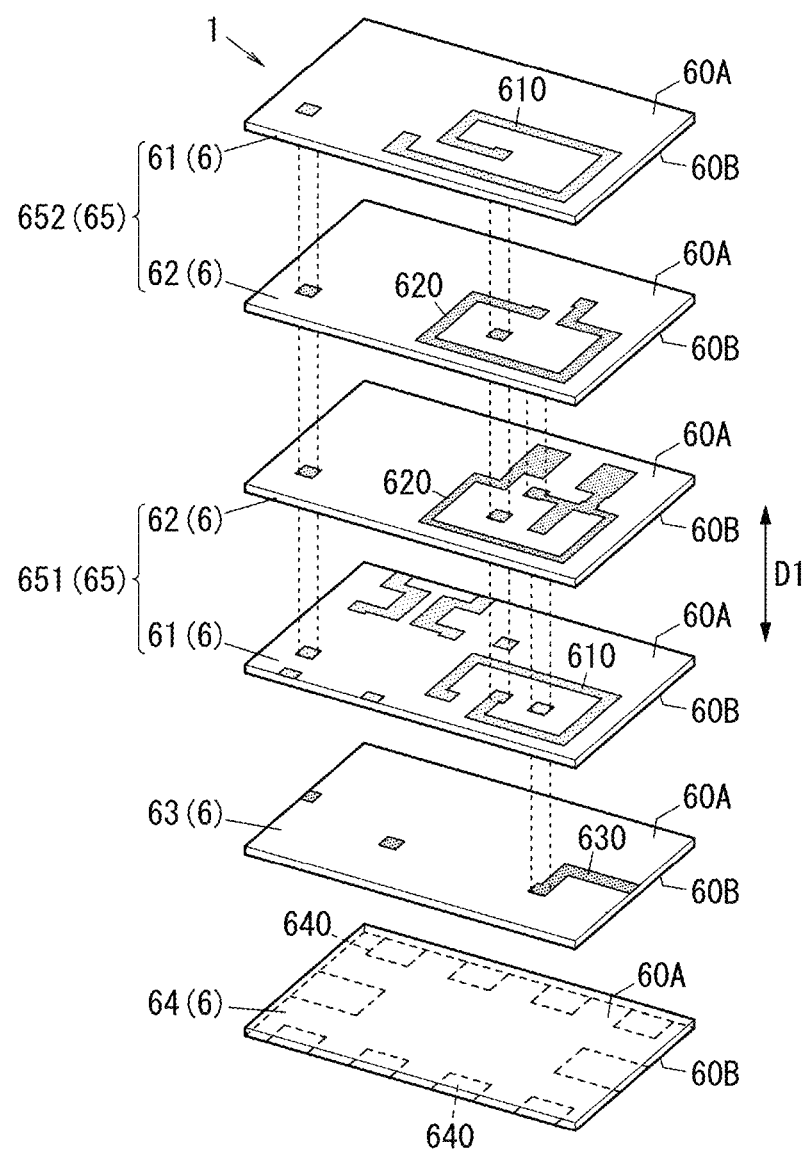
FIG. 2 is an exploded perspective view of a main section in a multilayer structure of a balanced filter according to a first example of a preferred embodiment of the present invention.

Next, a structure of the balanced filter 1 according to a first example of a preferred embodiment of the present invention will be described with reference to FIG. 2. FIG. 2 is an exploded perspective view of a main section in a multilayer structure of the balanced filter 1 according to the first example. In FIG. 2, there are illustrated, of multiple insulator layers 6 of the balanced filter 1, two first insulator layers 61, two second insulator layers 62, one third insulator layer 63, and one fourth insulator layer 64. The other insulator layers 6 are omitted from FIG. 2.

The balanced filter 1 according to the first example has, as illustrated in FIG. 2, a multilayer structure in which the multiple insulator layers 6 including the two first insulator layers 61, the two second insulator layers 62, the one third insulator layer 63, and the one fourth insulator layer 64 are stacked in a first direction D1. In the first example, the first direction D1 is a direction in which the multiple insulator layers 6 are stacked (hereinafter also referred to as "stacking direction D1"). A material of each of the multiple insulator layers 6 is preferably, for example, ceramic.

Each of the first insulator layers 61, the second insulator layers 62, the third insulator layer 63, and the fourth insulator layer 64 has plate shape. Each of the first insulator layers 61, the second insulator layers 62, the third insulator layer 63, and the fourth insulator layer 64 is rectangular or substantially rectangular, for example, when viewed in plan from the stacking direction D1.

Each of the first insulator layers 61, the second insulator layers 62, the third insulator layer 63, and the fourth insulator layer 64 includes a first main surface 60A and a second main surface 60B. The first main surface 60A and the second main surface 60B are opposite to each other in the stacking direction D1.

On the first main surface 60A of each of the first insulator layers 61, a first conductor portion 610 is provided. The first conductor portion 610 described herein is a first conductor layer including a first conductor pattern having a specific shape. A material of the first conductor portion 610 is preferably, for example, copper, silver, or an alloy of copper and silver. Furthermore, the material of the first conductor portion 610 may be, for example, aluminum, iron, nickel, molybdenum, or an alloy of aluminum, iron, nickel, and molybdenum. The first conductor portion 610 of one first insulator layer 61 (upper first insulator layer 61 in FIG. 2) has a shape in which the first conductor portion 610 is bent in a rectangular or substantially rectangular shape in a right-hand turning direction (clockwise) outward from a center when viewed in plan from the stacking direction D1. The first conductor portion 610 of the other first insulator layer 61 (lower first insulator layer 61 in FIG. 2) has a shape in which the first conductor portion 610 is bent in a rectangular or substantially rectangular shape in a left-hand turning direction (counterclockwise) outward from a center when viewed in plan from the stacking direction D1. The number of turns of each of two first conductor portions 610 is preferably one, for example. The two first conductor portions 610 are electrically connected by a via electrode provided along the stacking direction D1 and define the unbalanced-side inductor L2. In other words, the unbalanced-side inductor L2 includes the first conductor portions 610 provided on the first main surfaces 60A of the first insulator layers 61.

On the first main surface 60A of each of the second insulator layers 62, a second conductor portion 620 is provided. The second conductor portion 620 described herein is a second conductor layer including a second conductor pattern having a specific shape. A material of the second conductor portion 620 is preferably, for example, copper, silver, or an alloy of copper and silver. The second conductor portion 620 of each second insulator layer 62 has a rectangular or substantially rectangular frame shape when viewed in plan from the stacking direction D1. The number of turns of each of two second conductor portions 620 is preferably one, for example. The two second conductor portions 620 are electrically connected by a via electrode provided along the stacking direction D1 and define the balanced-side inductor L3. In other words, the balanced-side inductor L3 includes the second conductor portions 620 provided on the first main surfaces 60A of the second insulator layers 62.

On the first main surface 60A of the third insulator layer 63, a third conductor portion 630 is provided. The third conductor portion 630 described herein is a third conductor layer including a third conductor pattern having a specific shape. A material of the third conductor portion 630 is preferably, for example, copper, silver, or an alloy of copper and silver. The third conductor portion 630 of the third insulator layer 63 has a substantially L shape when viewed in plan from the stacking direction D1. The third conductor portion 630 is electrically connected to one second conductor portion 620 (lower second conductor portion 620 in FIG. 2) by a via electrode provided along the stacking direction D1 and defines and functions as the matching inductor L4. In other words, the matching inductor L4 includes the third conductor portion 630 provided on the first main surface 60A of the third insulator layer 63. Furthermore, the third conductor portion 630 is electrically connected to the balanced-side inductor L3 and also defines and functions as the power supply line 4. That is, the matching inductor L4 and the power supply line 4 are integrally provided with the third conductor portion 630.

On the second main surface 60B of the fourth insulator layer 64, a plurality of fourth conductor portions 640 are provided. The plurality of fourth conductor portions 640 are in a one-to-one correspondence with the above-described unbalanced terminal T1, first balanced terminal T21, second balanced terminal T22, and power supply terminal T3. In other words, each of the unbalanced terminal T1, the first balanced terminal T21, the second balanced terminal T22, and the power supply terminal T3 includes a fourth conductor portion 640 provided on the second main surface 60B of the fourth insulator layer 64.

As illustrated in FIG. 2, in the balanced filter 1 according to the first example, in an orientation in which the first main surface 60A is an upper side and the second main surface 60B is a lower side in the stacking direction D1, in the order from bottom to top, the fourth insulator layer 64, the third insulator layer 63, one first insulator layer 61, one second insulator layer 62, the other second insulator layer 62, and the other first insulator layer 61 are sequentially arranged.

In the example illustrated in FIG. 2, the one (lower) first insulator layer 61 of the two first insulator layers 61 and the one (lower) second insulator layer 62 of the two second insulator layers 62 are adjacent to each other in the stacking direction D1 to define a first stacked portion 651. Furthermore, the other (upper) first insulator layer 61 of the two first insulator layers 61 and the other (upper) second insulator layer 62 of the two second insulator layers 62 are adjacent to each other in the stacking direction D1 to define a second stacked portion 652.

In the balanced filter 1 according to the first example, in the stacking direction D1, in the order from bottom to top, the fourth insulator layer 64, the third insulator layer 63, the first stacked portion 651, and the second stacked portion 652 are sequentially arranged. In other words, in the balanced filter 1, in the stacking direction D1, the second conductor portion 620 of the first stacked portion 651 and the second conductor portion 620 of the second stacked portion 652 are adjacent to each other, and the third conductor portion 630 is adjacent to the first conductor portion 610 of the first stacked portion 651. Furthermore, in other words, in the balanced filter 1, in the stacking direction D1, from a side near the first main surface 60A of the fourth insulator layer 64, the third conductor portion 630, the first conductor portion 610 of the first stacked portion 651, the second conductor portion 620 of the first stacked portion 651, the second conductor portion 620 of the second stacked portion 652, and the first conductor portion 610 of the second stacked portion 652 are sequentially arranged.

When the first stacked portion 651 and the second stacked portion 652 do not have to be specifically distinguished from each other in the following description, each of the first stacked portion 651 and the second stacked portion 652 is also referred to as "stacked portion 65".

In the present description, "adjacent" refers to a configuration in which no conductor portion defining another circuit element (for example, a capacitor or the like) exists between two conductor portions in the stacking direction D1. For example, in FIG. 2, another insulator layer 6 exists between the first insulator layer 61 and the second insulator layer 62 that define the first stacked portion 651. In this case, when a conductor portion of the other insulator layer 6 is provided at a location where the conductor portion does not overlap the first conductor portion 610 and the second conductor portion 620 when viewed in plan from the stacking direction D1, it can be said that the first insulator layer 61 (the first conductor portion 610) and the second insulator layer 62 (the second conductor portion 620) are adjacent to each other. Note that a via electrode that provides an electrical connection between conductor portions does not have much influence on an electromagnetic field coupling between the conductor portions, and thus the via electrode may be provided at a location where the via electrode overlaps the conductor portions when viewed in plan from the stacking direction D1.

(3.2) Second Example

Figure 3:
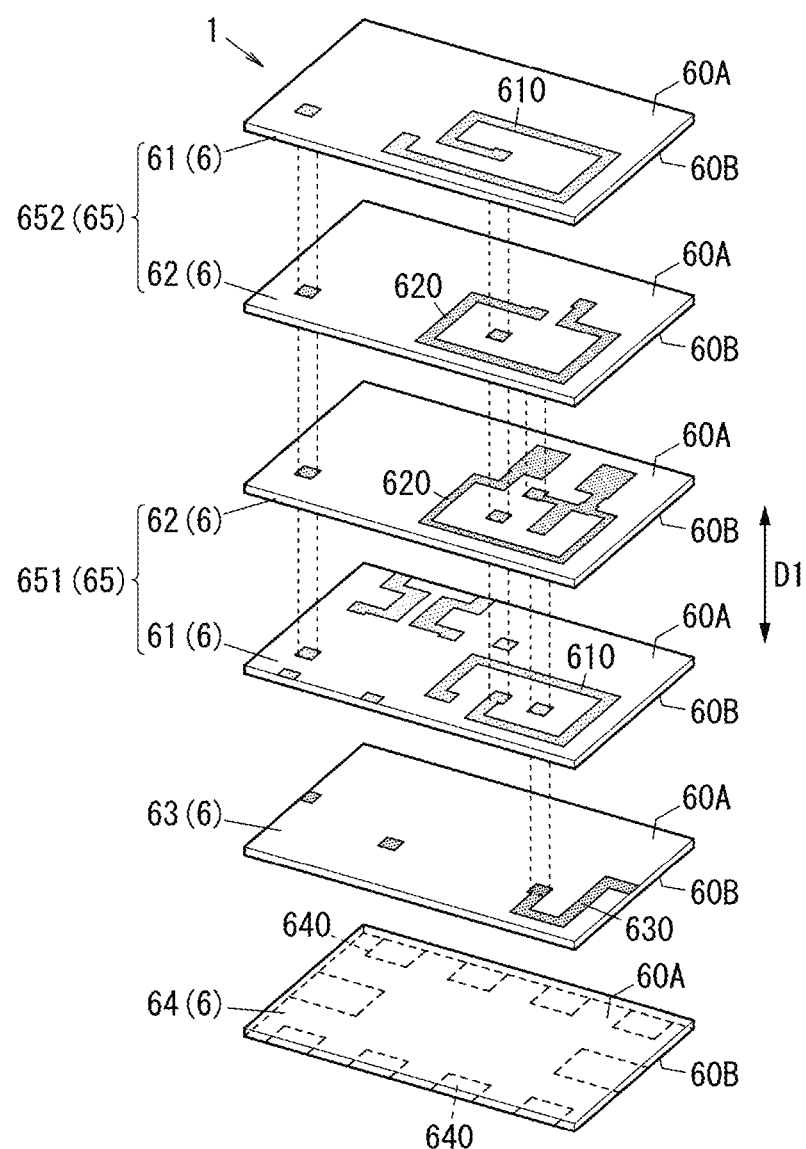
FIG. 3 is an exploded perspective view of a main section in a multilayer structure of a balanced filter according to a second example of a preferred embodiment of the present invention.

Next, a structure of the balanced filter 1 according to a second example of a preferred embodiment of the present invention will be described with reference to FIG. 3. FIG. 3 is an exploded perspective view of a main section in a multilayer structure of the balanced filter 1 according to the second example. In FIG. 3, of the multiple insulator layers 6 of the balanced filter 1, the two first insulator layers 61, the two second insulator layers 62, the one third insulator layer 63, and the one fourth insulator layer 64 are illustrated. The other insulator layers 6 are omitted from FIG. 3. Furthermore, in the balanced filter 1 according to the second example, the shape of the third conductor portion 630 provided on the first main surface 60A of the third insulator layer 63 differs from that in the balanced filter 1 according to the first example. Except for this configuration, the same or similar configuration is provided, the same or similar components are denoted by the same reference signs, and a description thereof is omitted.

The balanced filter 1 according to the second example has, as illustrated in FIG. 3, a multilayer structure in which the multiple insulator layers 6 including the two first insulator layers 61, the two second insulator layers 62, the one third insulator layer 63, and the one fourth insulator layer 64 are stacked in the first direction (stacking direction) D1.

In the balanced filter 1 according to the second example, the third conductor portion 630 has a substantially U shape when viewed in plan from the stacking direction D1.

(4) Characteristics of Balanced Filter

Next, characteristics of the balanced filter 1 will be described with reference to FIGS. 4A, 4B, 5A, and 5B. Here, a center frequency of a pass band of the balanced filter 1 according to the present preferred embodiment is preferably, for example, about 915 MHz.

(4.1) First Example

Figure 4A:
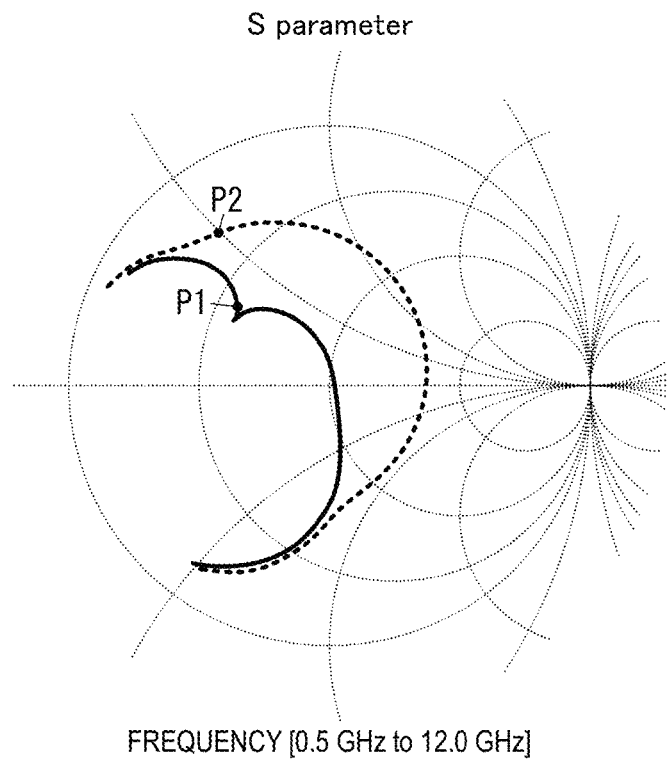
FIG. 4A is a Smith chart on a balanced terminal side of the balanced filter according to the first example of a preferred embodiment of the present invention.
Figure 4B:
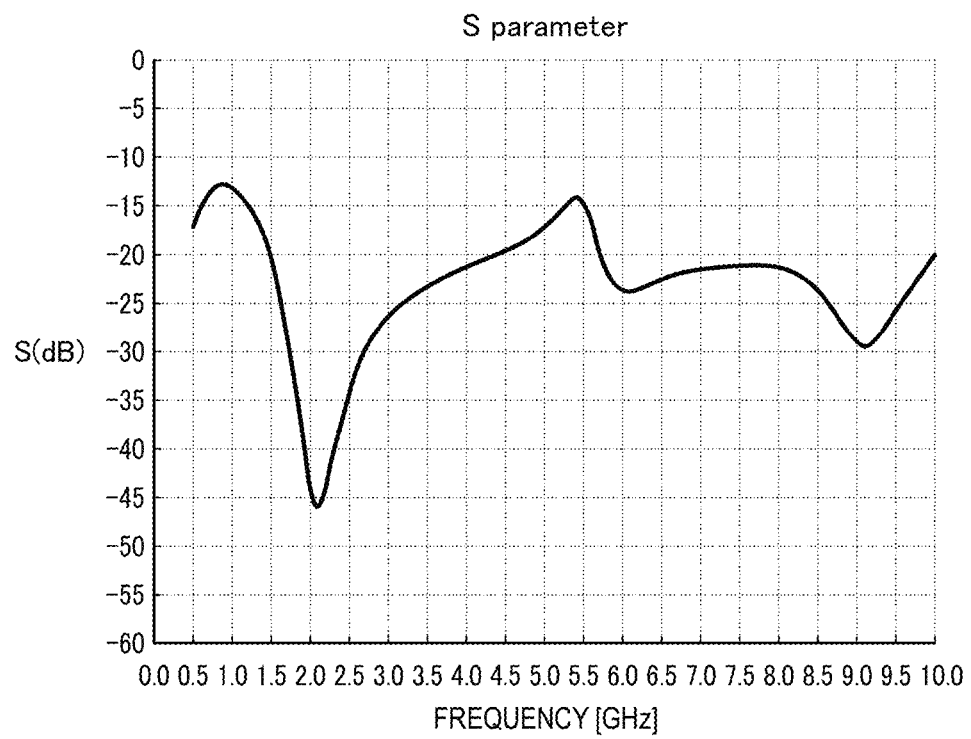
FIG. 4B illustrates frequency characteristics between an unbalanced terminal and balanced terminals of the above-described balanced filter.

FIG. 4A is a Smith chart on a balanced terminal side of the balanced filter 1 according to the first example. FIG. 4B illustrates frequency characteristics between the unbalanced terminal and the balanced terminals of the balanced filter 1 according to the first example. A solid line in FIG. 4A represents a first impedance between the first balanced terminal T21 and the second end 42 of the power supply line 4, and a dashed line in FIG. 4A represents a second impedance between the second balanced terminal T22 and the second end 42 of the power supply line 4. A solid line in FIG. 4B represents a common mode signal that becomes noise.

In the first example, the first impedance is a value at a point P1 in FIG. 4A, specifically about 10.126+j24.924Ω. Furthermore, the second impedance is a value at a point P2 in FIG. 4A, specifically about 20.908+j13.177Ω. In this case, it is seen from FIG. 4B that a common mode signal in the center frequency (about 915 MHz, for example) of the pass band of the balanced filter 1 has been attenuated by about 13 dB.

In the balanced filter 1 according to the first example, a function of the matching inductor L4 is provided by routing the power supply line 4 in, for example, an L shape.

Here, in the case where it is determined whether matching of the first impedance to the second impedance has been achieved, a determination can be made in accordance with a ratio of the second impedance to the first impedance, and the above-described ratio can be obtained from an imaginary part of each impedance.

In the first example, an imaginary part of the first impedance is about 24.924, and an imaginary part of the second impedance is about 13.177. Thus, a ratio of the second impedance to the first impedance is about 0.53 (13.177/24.924). In this case, as illustrated in FIG. 4B, the common mode signal in the pass band of the balanced filter 1 is attenuated, and it can be said that the matching of the first impedance to the second impedance has been achieved. That is, when the ratio of the second impedance to the first impedance is not less than about 0.5, it can be said that the matching of the first impedance to the second impedance has been achieved.

(4.2) Second Example

Figure 5A:
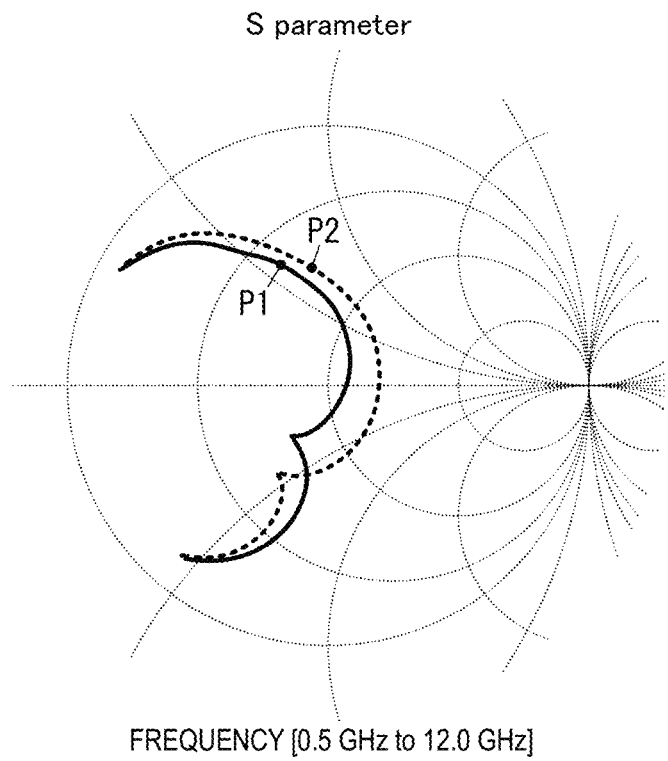
FIG. 5A is a Smith chart on a balanced terminal side of the balanced filter according to the second example of a preferred embodiment of the present invention.
Figure 5B:
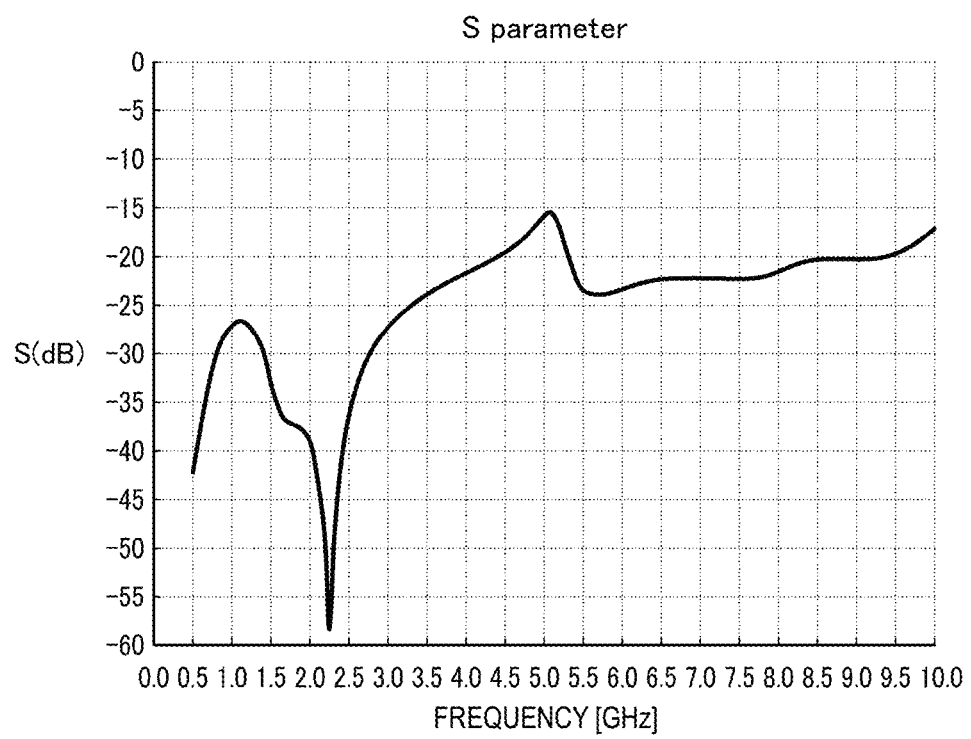
FIG. 5B illustrates frequency characteristics between an unbalanced terminal and balanced terminals of the above-described balanced filter.

FIG. 5A is a Smith chart on a balanced terminal side of the balanced filter 1 according to the second example. FIG. 5B illustrates frequency characteristics between the unbalanced terminal and the balanced terminals of the balanced filter 1 according to the second example. A solid line in FIG. 5A represents a first impedance between the first balanced terminal T21 and the second end 42 of the power supply line 4, and a dashed line in FIG. 5A represents a second impedance between the second balanced terminal T22 and the second end 42 of the power supply line 4. A solid line in FIG. 5B represents a common mode signal that becomes noise.

In the second example, the first impedance is a value at a point P1 in FIG. 5A, specifically about 30.247+j34.229Ω. Furthermore, the second impedance is a value at a point P2 in FIG. 5A, specifically about 24.285+j29.119Ω. In this case, it is seen from FIG. 5B that a common mode signal in the center frequency (about 915 MHz, for example) of the pass band of the balanced filter 1 has been attenuated by about 27 dB. In this case, the amount of attenuation of the common mode signal in the pass band increases in comparison with the first example, and filter characteristics are improved. This results from the fact that an impedance difference between the first impedance and the second impedance in the second example (see FIG. 5A) is smaller than that in the first example (see FIG. 4A).

In the balanced filter 1 according to the second example, the power supply line 4 is looped in, for example, a U shape. This can provide the matching inductor L4 having a larger inductance than that of the balanced filter 1 according to the first example.

In the second example, an imaginary part of the first impedance is about 34.229, and an imaginary part of the second impedance is about 29.119. Thus, a ratio of the second impedance to the first impedance is about 0.85 (29.119/34.229). In this case as well, the ratio of the second impedance to the first impedance is not less than about 0.5, and it can be said that matching of the first impedance to the second impedance has been achieved. Furthermore, in this case, the amount of attenuation of the common mode signal in the pass band increases in comparison with the first example, and it is thus desirable that the ratio of the second impedance to the first impedance is not less than 0.85.

(5) Advantageous Effects

The balanced filter 1 according to the present preferred embodiment includes the unbalanced terminal T1, the unbalanced-side inductor L2, the first balanced terminal T21, the second balanced terminal T22, the balanced-side inductor L3, the power supply line 4, and the matching network 5. The unbalanced-side inductor L2 is provided between the unbalanced terminal T1 and the ground. The balanced-side inductor L3 is provided between the first balanced terminal T21 and the second balanced terminal T22 and couples to the unbalanced-side inductor L2 via an electromagnetic field. With respect to the power supply line 4, the first end 41 is connected to the middle portion M1 of the balanced-side inductor L3, and the second end 42 is connected to the direct-current power supply 7. The matching network 5 matches the first impedance between the first balanced terminal T21 and the second end 42 of the power supply line 4 to the second impedance between the second balanced terminal T22 and the second end 42 of the power supply line 4.

The balanced filter 1 according to the present preferred embodiment includes the matching network 5 that matches the first impedance to the second impedance. For this reason, even when direct-current power from the direct-current power supply 7 is supplied to the balanced-side inductor L3, the first impedance can be matched to the second impedance. As a result, a common mode signal that becomes noise in the pass band of the balanced filter 1 can be attenuated, and desired input/output characteristics can be obtained.

Furthermore, in the balanced filter 1 according to the present preferred embodiment, the matching network 5 includes the matching inductor L4 connected to the power supply line 4. The matching inductor L4 couples to the balanced-side inductor L3 via an electromagnetic field. This configuration enables the common mode signal in the pass band to be more effectively attenuated.

Furthermore, in the balanced filter 1 according to the present preferred embodiment, the unbalanced-side inductor L2 further couples to the matching inductor L4 via an electromagnetic field. This configuration enables an improvement in bandpass characteristics of the filter in comparison with the case where the unbalanced-side inductor L2 is not coupled to the matching inductor L4 via an electromagnetic field.

Furthermore, the balanced filter 1 according to the present preferred embodiment has a multilayer structure in which the multiple insulator layers 6 including at least one first insulator layer 61, at least one second insulator layer 62, and at least one third insulator layer 63 are included. Each of the multiple insulator layers 6 includes the first main surface 60A and the second main surface 60B that are opposite to each other in the stacking direction D1 of the multiple insulator layers 6. The unbalanced-side inductor L2 includes the first conductor portion 610 provided on the first main surface 60A of the first insulator layer 61. The balanced-side inductor L3 includes the second conductor portion 620 provided on the first main surface 60A of the second insulator layer 62. The matching inductor L4 includes the third conductor portion 630 provided on the first main surface 60A of the third insulator layer 63. The first insulator layer 61 and the second insulator layer 62 are adjacent to each other in the stacking direction D1 to define the stacked portion 65. In the balanced filter 1, the third conductor portion 630 is adjacent to the first conductor portion 610 or second conductor portion 620 of the stacked portion 65 in the stacking direction D1. This configuration can strengthen an electromagnetic field coupling between the balanced-side inductor L3 and the matching inductor L4, and the first impedance can thus be matched to the second impedance. In particular, when the balanced filter 1 has a multilayer structure, the balanced filter 1 also has an advantage of enabling an electromagnetic field coupling between the balanced-side inductor L3 and the matching inductor L4 to be adjusted.

Furthermore, in the balanced filter 1 according to the present preferred embodiment, the multiple insulator layers 6 include two first insulator layers 61, two second insulator layers 62, and one third insulator layer 63. The unbalanced-side inductor L2 includes two first conductor portions 610 provided on the first main surfaces 60A of the two first insulator layers 61 in a one-to-one correspondence. The balanced-side inductor L3 includes two second conductor portions 620 provided on the first main surfaces 60A of the two second insulator layers 62 in a one-to-one correspondence. The balanced filter 1 includes, as the stacked portion 65, the first stacked portion 651 defined by one of the two first insulator layers 61 and one of the two second insulator layers 62, and the second stacked portion 652 defined by the other of the two first insulator layers 61 and the other of the two second insulator layers 62. In the balanced filter 1, in the stacking direction D1, the second conductor portion 620 of the first stacked portion 651 and the second conductor portion 620 of the second stacked portion 652 are adjacent to each other, and the third conductor portion 630 is adjacent to the first conductor portion 610 of the first stacked portion 651 or the first conductor portion 610 of the second stacked portion 652. This configuration can strengthen an electromagnetic field coupling between the balanced-side inductor L3 and the matching inductor L4 while strengthening an electromagnetic field coupling between the unbalanced-side inductor L2 and the matching inductor L4 in the balanced filter 1 having a two-layer structure.

Furthermore, in the balanced filter 1 according to the present preferred embodiment, the multiple insulator layers 6 further include the fourth insulator layer 64. The unbalanced terminal T1, the first balanced terminal T21, and the second balanced terminal T22 include the respective fourth conductor portions 640 provided on the second main surface 60B of the fourth insulator layer 64. In the balanced filter 1, in the stacking direction D1, from a side near the first main surface 60A of the fourth insulator layer 64, the third conductor portion 630, the first conductor portion 610 of the first stacked portion 651, the second conductor portion 620 of the first stacked portion 651, the second conductor portion 620 of the second stacked portion 652, and the first conductor portion 610 of the second stacked portion 652 are sequentially arranged. This configuration can strengthen an electromagnetic field coupling between the balanced-side inductor L3 and the matching inductor L4 while strengthening an electromagnetic field coupling between the unbalanced-side inductor L2 and the matching inductor L4 in the balanced filter 1 having a two-layer structure.

(6) Modifications (6.1) Modifications 1 to 4

Balanced filters 1A to 1D according to modifications 1 to 4 of preferred embodiments of the present invention will be described with reference to FIGS. 6A to 6D. FIGS. 6A to 6D each illustrate only the first conductor portions 610, the second conductor portions 620, and the third conductor portion 630. The first insulator layers 61, the second insulator layers 62, the third insulator layer 63, and the fourth insulator layer 64 are omitted from FIGS. 6A to 6D.

Figure 6A:
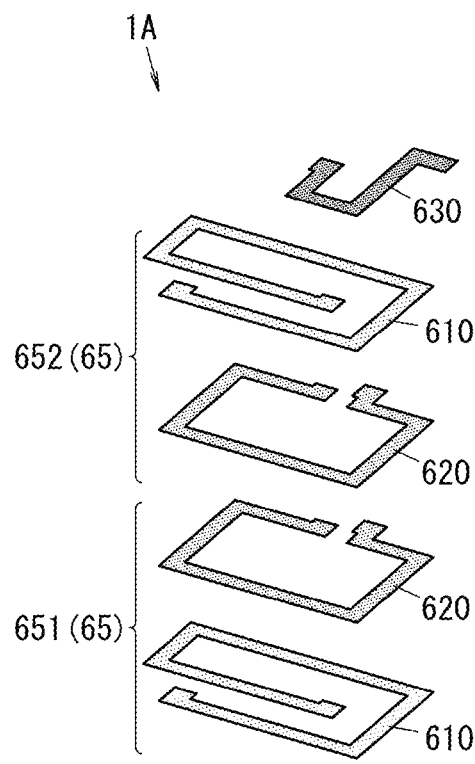
FIG. 6A is an exploded perspective view of a main section in a multilayer structure of a balanced filter according to a modification 1 of a preferred embodiment of the present invention.

First, the balanced filter 1A according to modification 1 will be described with reference to FIG. 6A. In the above-described preferred embodiment, the third conductor portion 630 is adjacent to the first conductor portion 610 of the first stacked portion 651 in the stacking direction D1. On the other hand, as in the balanced filter 1A, the third conductor portion 630 may be adjacent to the first conductor portion 610 of the second stacked portion 652 in the stacking direction D1 (see FIG. 6A). In other words, as in the balanced filter 1A, in the stacking direction D1, the second conductor portion 620 of the first stacked portion 651 and the second conductor portion 620 of the second stacked portion 652 are adjacent to each other, and the third conductor portion 630 may be adjacent to the first conductor portion 610 of the second stacked portion 652. Furthermore, in other words, as in the balanced filter 1A, in the stacking direction D1, from a side near the first main surface 60A of the fourth insulator layer 64, the first conductor portion 610 of the first stacked portion 651, the second conductor portion 620 of the first stacked portion 651, the second conductor portion 620 of the second stacked portion 652, the first conductor portion 610 of the second stacked portion 652, and the third conductor portion 630 may be sequentially arranged. Even this configuration can strengthen an electromagnetic field coupling between the balanced-side inductor L3 and the matching inductor L4 while strengthening an electromagnetic field coupling between the unbalanced-side inductor L2 and the matching inductor L4.

Figure 6B:
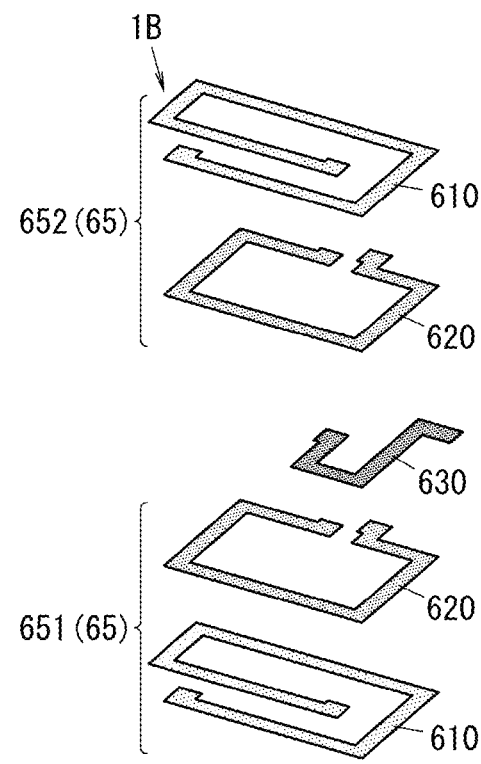
FIG. 6B is an exploded perspective view of a main section in a multilayer structure of a balanced filter according to a modification 2 of a preferred embodiment of the present invention.

Next, the balanced filter 1B according to modification 2 will be described with reference to FIG. 6B. In the above-described preferred embodiment, the third conductor portion 630 is located on a lower side of the first stacked portion 651 in the stacking direction D1. On the other hand, as in the balanced filter 1B, the third conductor portion 630 may be located between the first stacked portion 651 and the second stacked portion 652 in the stacking direction D1 (see FIG. 6B). In other words, as in the balanced filter 1B, the third conductor portion 630 may be adjacent to the second conductor portion 620 of the first stacked portion 651 and the second conductor portion 620 of the second stacked portion 652 in the stacking direction D1. Furthermore, in other words, as in the balanced filter 1B, in the stacking direction D1, from a side near the first main surface 60A of the fourth insulator layer 64, the first conductor portion 610 of the first stacked portion 651, the second conductor portion 620 of the first stacked portion 651, the third conductor portion 630, the second conductor portion 620 of the second stacked portion 652, and the first conductor portion 610 of the second stacked portion 652 may be sequentially arranged. Even this configuration can strengthen an electromagnetic field coupling between the balanced-side inductor L3 and the matching inductor L4 in the balanced filter 1B having a two-layer structure.

Figure 6C:
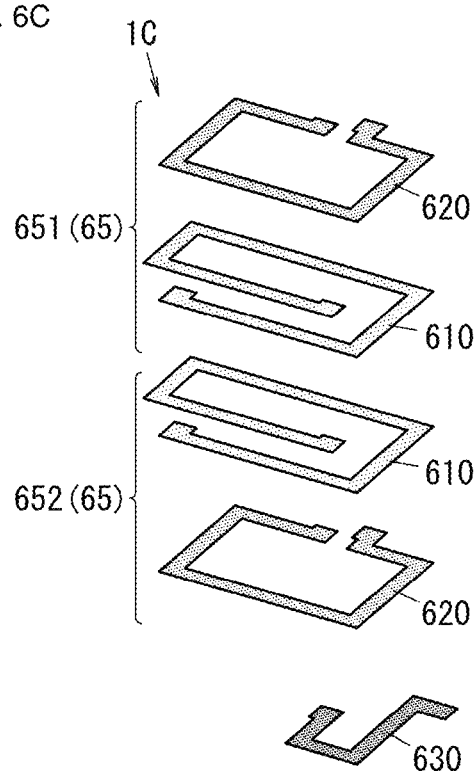
FIG. 6C is an exploded perspective view of a main section in a multilayer structure of a balanced filter according to a modification 3 of a preferred embodiment of the present invention.

Next, the balanced filter 1C according to modification 3 will be described with reference to FIG. 6C. In the above-described preferred embodiment, the first stacked portion 651 and the second stacked portion 652 are respectively a lower stacked portion and an upper stacked portion in the stacking direction D1. On the other hand, as in the balanced filter 1C, the second stacked portion 652 and the first stacked portion 651 may be respectively a lower stacked portion and an upper stacked portion in the stacking direction D1 (see FIG. 6C). In other words, as in the balanced filter 1C, the third conductor portion 630 may be adjacent to the second conductor portion 620 of the stacked portion 65 (the first stacked portion 651 or the second stacked portion 652) in the stacking direction D1. Furthermore, in other words, as in the balanced filter 1C, in the stacking direction D1, from a side near the first main surface 60A of the fourth insulator layer 64, the third conductor portion 630, the second conductor portion 620 of the second stacked portion 652, the first conductor portion 610 of the second stacked portion 652, the first conductor portion 610 of the first stacked portion 651, and the second conductor portion 620 of the first stacked portion 651 may be sequentially arranged. Even this configuration can strengthen an electromagnetic field coupling between the balanced-side inductor L3 and the matching inductor L4, and the first impedance can thus be matched to the second impedance.

Figure 6D:
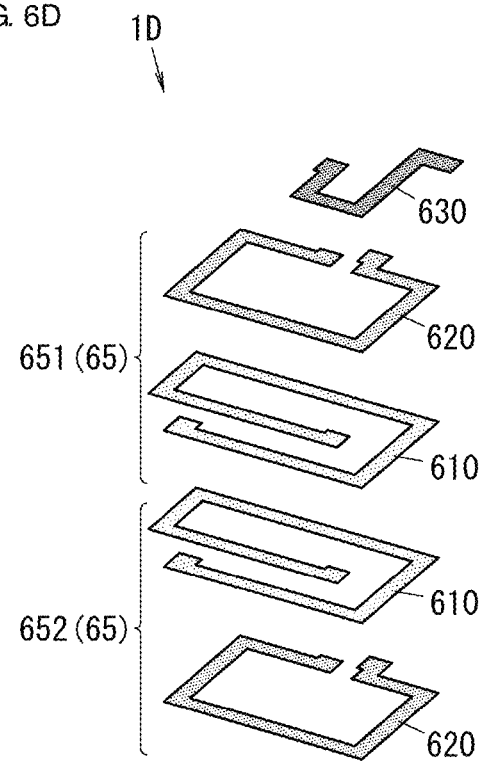
FIG. 6D is an exploded perspective view of a main section in a multilayer structure of a balanced filter according to a modification 4 of a preferred embodiment of the present invention.

Next, the balanced filter 1D according to the modification 4 will be described with reference to FIG. 6D. In the above-described modification 3, the third conductor portion 630 is located on a lower side of the second stacked portion 652 in the stacking direction D1. On the other hand, as in the balanced filter 1D, the third conductor portion 630 may be located on an upper side of the first stacked portion 651 in the stacking direction D1 (see FIG. 6D). In other words, as in the balanced filter 1D, the third conductor portion 630 may be adjacent to the second conductor portion 620 of the stacked portion 65 (the first stacked portion 651 or the second stacked portion 652) in the stacking direction D1. Furthermore, in other words, as in the balanced filter 1D, in the stacking direction D1, from a side near the first main surface 60A of the fourth insulator layer 64, the second conductor portion 620 of the second stacked portion 652, the first conductor portion 610 of the second stacked portion 652, the first conductor portion 610 of the first stacked portion 651, the second conductor portion 620 of the first stacked portion 651, and the third conductor portion 630 may be sequentially arranged. Even this configuration can strengthen an electromagnetic field coupling between the balanced-side inductor L3 and the matching inductor L4, and the first impedance can thus be matched to the second impedance.

(6.2) Modifications 5 to 8

Balanced filters 1E to 1H according to modifications 5 to 8 of preferred embodiments of the present invention will be described with reference to FIGS. 7A to 7D. FIGS. 7A to 7D each illustrate only the first conductor portion 610, the second conductor portion 620, and the third conductor portion 630. The first insulator layer 61, the second insulator layer 62, the third insulator layer 63, and the fourth insulator layer 64 are omitted from FIGS. 7A to 7D.

Figure 7A:
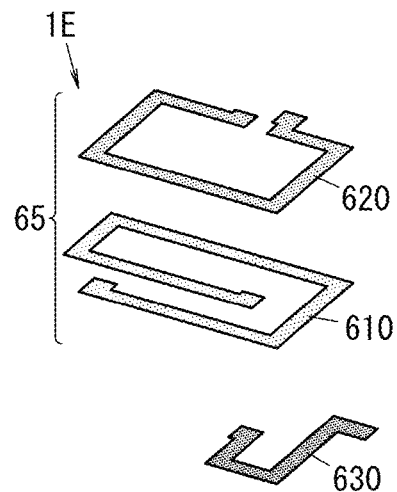
FIG. 7A is an exploded perspective view of a main section in a multilayer structure of a balanced filter according to a modification 5 of a preferred embodiment of the present invention.

First, the balanced filter 1E according to modification 5 will be described with reference to FIG. 7A. In the above-described preferred embodiment and modifications 1 to 4, although two first conductor portions 610 and two second conductor portions 620 are provided, one first conductor portion 610 and one second conductor portion 620 may be provided. The balanced filter 1E includes a stacked portion 65 as illustrated in FIG. 7A. The stacked portion 65 is defined by the first conductor portion 610 (first insulator layer 61) and the second conductor portion 620 (second insulator layer 62) that are adjacent to each other in the stacking direction D1. Then, in the balanced filter 1E, the third conductor portion 630 is adjacent to the first conductor portion 610 of the stacked portion 65 in the stacking direction D1. In other words, in the balanced filter 1E, in the stacking direction D1, from a side near the first main surface 60A of the fourth insulator layer 64, the third conductor portion 630, the first conductor portion 610, and the second conductor portion 620 are sequentially arranged. Even this configuration can strengthen an electromagnetic field coupling between the balanced-side inductor L3 and the matching inductor L4 while strengthening an electromagnetic field coupling between the unbalanced-side inductor L2 and the matching inductor L4.

Figure 7B:
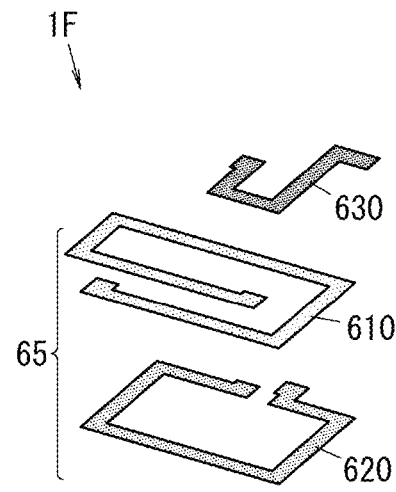
FIG. 7B is an exploded perspective view of a main section in a multilayer structure of a balanced filter according to a modification 6 of a preferred embodiment of the present invention.

Next, the balanced filter 1F according to modification 6 will be described with reference to FIG. 7B. In the above-described modification 5, the first conductor portion 610 and the second conductor portion 620 are respectively a lower conductor portion and an upper conductor portion in the stacking direction D1. On the other hand, as in the balanced filter 1F, the second conductor portion 620 and the first conductor portion 610 may be respectively a lower conductor portion and an upper conductor portion in the stacking direction D1 (see FIG. 7B). In other words, as in the balanced filter 1F, the third conductor portion 630 may be adjacent to the first conductor portion 610 of the stacked portion 65 in the stacking direction D1. Furthermore, in other words, as in the balanced filter 1F, in the stacking direction D1, from a side near the first main surface 60A of the fourth insulator layer 64, the second conductor portion 620 of the stacked portion 65, the first conductor portion 610 of the stacked portion 65, and the third conductor portion 630 may be sequentially arranged. Even this configuration can strengthen an electromagnetic field coupling between the balanced-side inductor L3 and the matching inductor L4 while strengthening an electromagnetic field coupling between the unbalanced-side inductor L2 and the matching inductor L4.

Figure 7C:
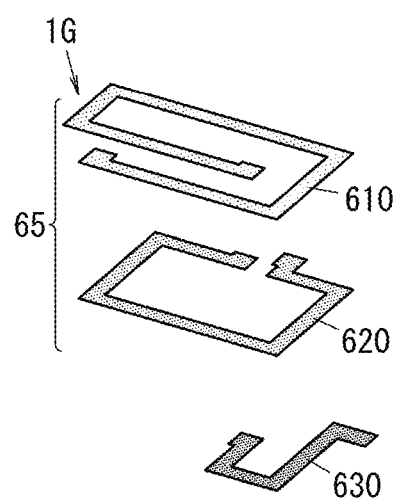
FIG. 7C is an exploded perspective view of a main section in a multilayer structure of a balanced filter according to a modification 7 of a preferred embodiment of the present invention.

Next, the balanced filter 1G according to modification 7 will be described with reference to FIG. 7C. In the above-described modifications 5 and 6, the third conductor portion 630 is adjacent to the first conductor portion 610 of the stacked portion 65 in the stacking direction D1. On the other hand, as in the balanced filter 1G, the third conductor portion 630 may be adjacent to the second conductor portion 620 of the stacked portion 65 in the stacking direction D1 (see FIG. 7C). In other words, as in the balanced filter 1G, in the stacking direction D1, from a side near the first main surface 60A of the fourth insulator layer 64, the third conductor portion 630, the second conductor portion 620 of the stacked portion 65, and the first conductor portion 610 of the stacked portion 65 may be sequentially arranged. Even this configuration can strengthen an electromagnetic field coupling between the balanced-side inductor L3 and the matching inductor L4, and the first impedance can thus be matched to the second impedance.

Figure 7D:
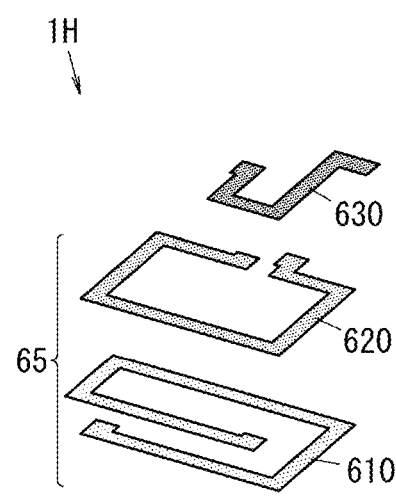
FIG. 7D is an exploded perspective view of a main section in a multilayer structure of a balanced filter according to a modification 8 of a preferred embodiment of the present invention.

Next, the balanced filter 1H according to modification 8 will be described with reference to FIG. 7D. In the above-described modification 5, the third conductor portion 630 is located on a lower side of the stacked portion 65 in the stacking direction D1. On the other hand, as in the balanced filter 1H, the third conductor portion 630 may be located on an upper side of the stacked portion 65 in the stacking direction D1 (see FIG. 7D). In other words, as in the balanced filter 1H, the third conductor portion 630 may be adjacent to the second conductor portion 620 of the stacked portion 65 in the stacking direction D1. Furthermore, in other words, as in the balanced filter 1H, in the stacking direction D1, from a side near the first main surface 60A of the fourth insulator layer 64, the first conductor portion 610 of the stacked portion 65, the second conductor portion 620 of the stacked portion 65, and the third conductor portion 630 may be sequentially arranged. Even this configuration can strengthen an electromagnetic field coupling between the balanced-side inductor L3 and the matching inductor L4, and the first impedance can thus be matched to the second impedance.

(6.3) Other Modifications

The above-described preferred embodiments or the like are merely examples of various preferred embodiments of the present invention. Various changes can be made to the above-described preferred embodiments or the like in accordance with a design or the like as long as the advantageous effects of the present invention can be achieved. Modifications of the above-described preferred embodiments or the like will be described below.

In the above-described preferred embodiments, although the case is illustrated where one third insulator layer 63 is provided, the number of third insulator layers 63 is not limited to one and may be two or more. For example, assume that two third insulator layers 63 are included in the multi-layer structure illustrated in FIG. 2. In this case, in consideration of symmetry in the stacking direction D1, it is preferable that the third insulator layers 63 are disposed on both respective sides of the first stacked portion 651 and second stacked portion 652. Furthermore, one of the two third insulator layers 63 may be disposed between the first stacked portion 651 and the second stacked portion 652 in the stacking direction D1.

In the above-described preferred embodiments, although the case is illustrated where one or two first insulator layers 61 and one or two second insulator layers 62 are provided, three or more first insulator layers 61 and three or more second insulator layers 62 may be provided. Furthermore, the number of first insulator layers 61 does not have to be the same as the number of second insulator layers 62, and the number of first insulator layers 61 may be greater than or less than the number of second insulator layers 62.

In the above-described preferred embodiments, although the case is illustrated where the low pass filter 21 is a π-type low pass filter, the low pass filter 21 is not limited to the π-type low pass filter and may be, for example, a T-type low pass filter or L-type low pass filter.

In the above-described preferred embodiments, although the case is illustrated where the center frequency of the pass band of the balanced filter 1 is about 915 MHz, the center frequency of the pass band of the balanced filter 1 is not limited to about 915 MHz and only has to be, for example, within a range of about 300 MHz to about 3 GHz.

The following elements and features are disclosed in accordance with the above-described preferred embodiments or the like.

A balanced filter (1; 1A to 1H) according to a preferred embodiment of the present invention includes an unbalanced terminal (T1), an unbalanced-side inductor (L2), a first balanced terminal (T21), a second balanced terminal (T22), a balanced-side inductor (L3), a power supply line (4), and a matching network (5). The unbalanced-side inductor (L2) is provided between the unbalanced terminal (T1) and a ground. The balanced-side inductor (L3) is provided between the first balanced terminal (T21) and the second balanced terminal (T22) and couples to the unbalanced-side inductor (L2) via an electromagnetic field. The power supply line (4) includes a first end (41) connected to a middle portion (M1) of the balanced-side inductor (L3) and a second end (42) connected to a direct-current power supply (7). The matching network (5) matches a first impedance between the first balanced terminal (T21) and the second end (42) of the power supply line (4) to a second impedance between the second balanced terminal (T22) and the second end (42) of the power supply line (4).

The above-described preferred embodiment enables attenuation of a common mode signal that becomes noise in a pass band.

In a balanced filter (1; 1A to 1H) according to a preferred embodiment of the present invention, the matching network (5) includes a matching inductor (L4) connected to the power supply line (4). The matching inductor (L4) couples to the balanced-side inductor (L3) via an electromagnetic field.

The above-described preferred embodiment enables more effective attenuation of a common mode signal that becomes noise in the pass band.

In a balanced filter (1; 1A to 1H) according to a preferred embodiment of the present invention, the matching inductor (L4) further couples to the unbalanced-side inductor (L2) via an electromagnetic field.

The above-described preferred embodiment enables an improvement in bandpass characteristics of the filter in comparison with the case where the matching inductor (L4) is not coupled to the unbalanced-side inductor (L2) via an electromagnetic field.

A balanced filter (1; 1A to 1H) according to a preferred embodiment of the present invention has a multilayer structure in which multiple insulator layers (6) including at least one first insulator layer (61), at least one second insulator layer (62), and at least one third insulator layer (63) are included. Each of the multiple insulator layers (6) includes a first main surface (60A) and a second main surface (60B) that are opposite to each other in a stacking direction (D1) of the multiple insulator layers (6). The unbalanced-side inductor (L2) includes a first conductor portion (610) provided on the first main surface (60A) of the first insulator layer (61). The balanced-side inductor (L3) includes a second conductor portion (620) provided on the first main surface (60A) of the second insulator layer (62). The matching inductor (L4) includes a third conductor portion (630) provided on the first main surface (60A) of the third insulator layer (63). The first insulator layer (61) and the second insulator layer (62) are adjacent to each other in the stacking direction (D1) to constitute a stacked portion (65). In the balanced filter (1; 1A to 1H), the third conductor portion (630) is adjacent to the first conductor portion (610) or the second conductor portion (620) of the stacked portion (65) in the stacking direction (D1).

The above-described preferred embodiment enables an electromagnetic field coupling between the balanced-side inductor (L3) and the matching inductor (L4) to be strengthened, and the first impedance can thus be matched to the second impedance.

In a balanced filter (1E; 1F) according to a preferred embodiment of the present invention, the multiple insulator layers (6) include one first insulator layer (61), one second insulator layer (62), and one third insulator layer (63). In the balanced filter (1E; 1F), the third conductor portion (630) is adjacent to the first conductor portion (610) of the stacked portion (65) in the stacking direction (D1).

The above-described preferred embodiment enables an electromagnetic field coupling between the balanced-side inductor (L3) and the matching inductor (L4) to be strengthened while strengthening an electromagnetic field coupling between the unbalanced-side inductor (L2) and the matching inductor (L4).

In a balanced filter (1E) according to a preferred embodiment of the present invention, the multiple insulator layers (6) further include a fourth insulator layer (64). Each of the unbalanced terminal (T1), the first balanced terminal (T21), and the second balanced terminal (T22) includes a fourth conductor portion (640) provided on the second main surface (60B) of the fourth insulator layer (64). In the balanced filter (1E), in the stacking direction (D1), from a side near the first main surface (60A) of the fourth insulator layer (64), the third conductor portion (630), the first conductor portion (610), and the second conductor portion (620) are sequentially arranged.

The above-described preferred embodiment enables an electromagnetic field coupling between the balanced-side inductor (L3) and the matching inductor (L4) to be strengthened while strengthening an electromagnetic field coupling between the unbalanced-side inductor (L2) and the matching inductor (L4).

In a balanced filter (1; 1A) according to a preferred embodiment of the present invention, the multiple insulator layers (6) include two first insulator layers (61), two second insulator layers (62), and one third insulator layer (63). The unbalanced-side inductor (L2) includes two first conductor portions (610) provided on the first main surfaces (60A) of the two first insulator layers (61) in a one-to-one correspondence. The balanced-side inductor (L3) includes two second conductor portions (620) provided on the first main surfaces (60A) of the two second insulator layers (62) in a one-to-one correspondence. The balanced filter (1; 1A) includes, as the stacked portion (65), a first stacked portion (651) defined by one of the two first insulator layers (61) and one of the two second insulator layers (62), and a second stacked portion (652) defined by another of the two first insulator layers (61) and another of the two second insulator layers (62). In the balanced filter (1; 1A), in the stacking direction (D1), the second conductor portion (620) of the first stacked portion (651) and the second conductor portion (620) of the second stacked portion (652) are adjacent to each other, and the third conductor portion (630) is adjacent to the first conductor portion (610) of the first stacked portion (651) or the first conductor portion (610) of the second stacked portion (652).

The above-described preferred embodiment enables an electromagnetic field coupling between the balanced-side inductor (L3) and the matching inductor (L4) to be strengthened while strengthening an electromagnetic field coupling between the unbalanced-side inductor (L2) and the matching inductor (L4) in the balanced filter (1; 1A) having a two-layer structure.

In a balanced filter (1) according to a preferred embodiment of the present invention, the multiple insulator layers (6) further include a fourth insulator layer (64). The unbalanced terminal (T1), the first balanced terminal (T21), and the second balanced terminal (T22) include respective fourth conductor portions (640) provided on the second main surface (60B) of the fourth insulator layer (64). In the balanced filter (1), in the stacking direction (D1), from a side near the first main surface (60A) of the fourth insulator layer (64), the third conductor portion (630), the first conductor portion (610) of the first stacked portion (651), the second conductor portion (620) of the first stacked portion (651), the second conductor portion (620) of the second stacked portion (652), and the first conductor portion (610) of the second stacked portion (652) are sequentially arranged.

The above-described preferred embodiment enables an electromagnetic field coupling between the balanced-side inductor (L3) and the matching inductor (L4) to be strengthened while strengthening an electromagnetic field coupling between the unbalanced-side inductor (L2) and the matching inductor (L4) in the balanced filter (1) having a two-layer structure.

In a balanced filter (1B) according to a preferred embodiment of the present invention, the multiple insulator layers (6) include two first insulator layers (61), two second insulator layers (62), and one third insulator layer (63). The unbalanced-side inductor (L2) includes two first conductor portions (610) provided on the first main surfaces (60A) of the two first insulator layers (61) in a one-to-one correspondence. The balanced-side inductor (L3) includes two second conductor portions (620) provided on the first main surfaces (60A) of the two second insulator layers (62) in a one-to-one correspondence. The balanced filter (1B) includes, as the stacked portion (65), a first stacked portion (651) defined by one of the two first insulator layers (61) and one of the two second insulator layers (62), and a second stacked portion (652) defined by another of the two first insulator layers (61) and another of the two second insulator layers (62). In the balanced filter (1B), the third conductor portion (630) is adjacent to the second conductor portion (620) of the first stacked portion (651) and the second conductor portion (620) of the second stacked portion (652) in the stacking direction (D1).

The above-described preferred embodiment enables an electromagnetic field coupling between the balanced-side inductor (L3) and the matching inductor (L4) to be strengthened in the balanced filter (1B) having a two-layer structure.

Configurations according to the above-described preferred embodiments are not necessary for the balanced filter (1; 1A to 1H), and omission is possible as appropriate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balanced filter comprising:
an unbalanced terminal;
an unbalanced-side inductor provided between the unbalanced terminal and a ground;
a first balanced terminal;
a second balanced terminal;
a balanced-side inductor provided between the first balanced terminal and the second balanced terminal and configured to couple to the unbalanced-side inductor via an electromagnetic field;
a power supply line including a first end connected to a middle portion of the balanced-side inductor and a second end connected to a direct-current power supply; and
a matching network configured to match a first impedance between the first balanced terminal and the second end of the power supply line to a second impedance between the second balanced terminal and the second end of the power supply line; wherein
the matching network includes a matching inductor connected to the power supply line; and
the matching inductor couples to the balanced-side inductor via an electromagnetic field.

2. The balanced filter according to claim 1, wherein
the balanced-side inductor includes first, second, and third inductors;
one end of the first inductor is electrically connected to the first balanced terminal;
another end of the first inductor is electrically connected to one end of the second inductor;
another end of the second inductor is electrically connected to one end of the third inductor;
another end of the third inductor is electrically connected to the second balanced terminal.

3. The balanced filter according to claim 1, wherein the matching inductor further couples to the unbalanced-side inductor via an electromagnetic field.

4. The balanced filter according to claim 1, wherein
the balanced filter has a multilayer structure in which a plurality of insulator layers including at least one first insulator layer, at least one second insulator layer, and at least one third insulator layer are included;
each of the plurality of insulator layers includes a first main surface and a second main surface that are opposite to each other in a stacking direction of the plurality of insulator layers;
the unbalanced-side inductor includes a first conductor portion provided on the first main surface of the first insulator layer;
the balanced-side inductor includes a second conductor portion provided on the first main surface of the second insulator layer;
the matching inductor includes a third conductor portion provided on the first main surface of the third insulator layer;
the first insulator layer and the second insulator layer are adjacent to each other in the stacking direction to define a stacked portion; and
the third conductor portion is adjacent to the first conductor portion or the second conductor portion of the stacked portion in the stacking direction.

5. The balanced filter according to claim 4, wherein
the plurality of insulator layers include one first insulator layer, one second insulator layer, and one third insulator layer; and
the third conductor portion is adjacent to the first conductor portion of the stacked portion in the stacking direction.

6. The balanced filter according to claim 5, wherein
the plurality of insulator layers further include a fourth insulator layer;
each of the unbalanced terminal, the first balanced terminal, and the second balanced terminal includes a fourth conductor portion provided on the second main surface of the fourth insulator layer; and
in the stacking direction, from a side near the first main surface of the fourth insulator layer, the third conductor portion, the first conductor portion, and the second conductor portion are sequentially arranged.

7. The balanced filter according to claim 4, wherein
the plurality of insulator layers include two first insulator layers, two second insulator layers, and one third insulator layer;
the unbalanced-side inductor includes two first conductor portions provided on the first main surfaces of the two first insulator layers in a one-to-one correspondence;
the balanced-side inductor includes two second conductor portions provided on the first main surfaces of the two second insulator layers in a one-to-one correspondence;

the balanced filter includes, as the stacked portion, a first stacked portion defined by one of the two first insulator layers and one of the two second insulator layers, and a second stacked portion defined by another of the two first insulator layers and another of the two second insulator layers; and in the stacking direction, the second conductor portion of the first stacked portion and the second conductor portion of the second stacked portion are adjacent to each other, and the third conductor portion is adjacent to the first conductor portion of the first stacked portion or the first conductor portion of the second stacked portion.

8. The balanced filter according to claim 7, wherein
the plurality of insulator layers further include a fourth insulator layer;
the unbalanced terminal, the first balanced terminal, and the second balanced terminal include respective fourth conductor portions provided on the second main surface of the fourth insulator layer; and
in the stacking direction, from a side near the first main surface of the fourth insulator layer, the third conductor portion, the first conductor portion of the first stacked portion, the second conductor portion of the first stacked portion, the second conductor portion of the second stacked portion, and the first conductor portion of the second stacked portion are sequentially arranged.

9. The balanced filter according to claim 4, wherein
the plurality of insulator layers include two first insulator layers, two second insulator layers, and one third insulator layer;
the unbalanced-side inductor includes two first conductor portions provided on the first main surfaces of the two first insulator layers in a one-to-one correspondence;
the balanced-side inductor includes two second conductor portions provided on the first main surfaces of the two second insulator layers in a one-to-one correspondence;
the balanced filter includes, as the stacked portion, a first stacked portion defined by one of the two first insulator layers and one of the two second insulator layers, and a second stacked portion defined by another of the two first insulator layers and another of the two second insulator layers; and
the third conductor portion is adjacent to the second conductor portion of the first stacked portion and the second conductor portion of the second stacked portion in the stacking direction.

10. The balanced filter according to claim 1, wherein
the balanced-side inductor includes a first inductor, a second inductor, and a third inductor; and
the unbalanced-side inductor couples mainly to the second inductor via the electromagnetic field.

11. The balanced filter according to claim 1, wherein
an imaginary part of the first impedance is larger than an imaginary part of the second impedance; and
a ratio of the imaginary part of the second impedance to the imaginary part of the first impedance is not less than about 0.5 and not more than about 1.

12. The balanced filter according to claim 1, wherein
an imaginary part of the second impedance is larger than an imaginary part of the first impedance; and
a ratio of the imaginary part of the first impedance to the imaginary part of the second impedance is not less than about 0.5 and not more than about 1.

13. A balanced filter comprising:
an unbalanced terminal;
an unbalanced-side inductor provided between the unbalanced terminal and a ground;
a low pass filter provided between the unbalanced terminal and the unbalanced-side inductor;
a first balanced terminal;
a second balanced terminal;
a balanced-side inductor provided between the first balanced terminal and the second balanced terminal and configured to couple to the unbalanced-side inductor via an electromagnetic field;
a power supply line including a first end connected to a middle portion of the balanced-side inductor and a second end connected to a direct-current power supply; and
a matching network configured to match a first impedance between the first balanced terminal and the second end of the power supply line to a second impedance between the second balanced terminal and the second end of the power supply line.

14. The balanced filter according to claim 13, wherein the low pass filter is a π-type low pass filter.

15. The balanced filter according to claim 13, wherein
the low pass filter includes an inductor and two capacitors;
one end of the inductor is electrically connected to the unbalanced terminal and another end of the inductor in electrically connected to one end of the unbalanced-side inductor; and
another end of the unbalanced-side inductor is electrically connected to the ground.

16. The balanced filter according to claim 15, wherein
one of the two capacitors is provided between the unbalanced terminal and the ground; and
another one of the two capacitors is provided between a connection point of the inductor and the unbalanced-side inductor and the ground.

17. The balanced filter according to claim 16, wherein the unbalanced-side inductor and the another one of the two capacitors define an LC parallel resonant circuit.

18. A balanced filter comprising:
an unbalanced terminal;
an unbalanced-side inductor provided between the unbalanced terminal and a ground;
a first balanced terminal;
a second balanced terminal;
a balanced-side inductor provided between the first balanced terminal and the second balanced terminal and configured to couple to the unbalanced-side inductor via an electromagnetic field;
a power supply line including a first end connected to a middle portion of the balanced-side inductor and a second end connected to a direct-current power supply;
a matching network configured to match a first impedance between the first balanced terminal and the second end of the power supply line to a second impedance between the second balanced terminal and the second end of the power supply line; and
first, second, third, and fourth capacitors; wherein
the balanced-side inductor includes first, second, and third inductors;
one end of the first inductor is electrically connected to the first balanced terminal;
another end of the first inductor is electrically connected to one end of the second inductor;

another end of the second inductor is electrically connected to one end of the third inductor;

another end of the third inductor is electrically connected to the second balanced terminal;

the first capacitor is provided between a connection point of the first inductor and the second inductor and a connection point of the second inductor and the third inductor;

the second capacitor is provided between the first balanced terminal and the second balanced terminal;

the third capacitor is provided between the first balanced terminal and the ground; and the fourth capacitor is provided between the second balanced terminal and the ground.

19. The balanced filter according to claim 18, wherein the balanced-side inductor, the first capacitor, and the second capacitor define an LC parallel resonant circuit.

* * * * *